US006167583B1

United States Patent
Miyashita et al.

(10) Patent No.: US 6,167,583 B1
(45) Date of Patent: Jan. 2, 2001

(54) DOUBLE SIDE CLEANING APPARATUS FOR SEMICONDUCTOR SUBSTRATE

(75) Inventors: Naoto Miyashita; Masahiro Abe, both of Yokohama (JP)

(73) Assignee: Kabushiki Kaisha Toshiba, Kawasaki (JP)

( * ) Notice: Under 35 U.S.C. 154(b), the term of this patent shall be extended for 0 days.

(21) Appl. No.: 09/078,132

(22) Filed: May 14, 1998

(30) Foreign Application Priority Data

May 15, 1997 (JP) .................................................... 9-139156

(51) Int. Cl.$^7$ ...................................................... B08B 3/02
(52) U.S. Cl. .................. 15/77; 15/88.3; 15/102; 15/302; 134/90.2; 134/95.2; 134/172; 134/199
(58) Field of Search ............................... 15/77, 88.3, 102, 15/302; 134/902, 95.2, 172, 174, 199, 1.3, 1

(56) References Cited

U.S. PATENT DOCUMENTS

| 4,728,552 | * | 3/1988 | Jensen, Jr. ............................. 428/91 |
| 5,048,549 | * | 9/1991 | Hethcoat .............................. 134/172 |
| 5,350,428 | * | 9/1994 | Leroux et al. ......................... 134/1.3 |
| 5,723,019 | * | 3/1998 | Krusell et al. ........................ 134/902 |
| 5,806,126 | * | 9/1998 | De Larios et al. ...................... 15/77 |
| 5,846,335 |   | 12/1998 | Maekawa et al. . |
| 5,858,109 | * | 1/1999 | Hymes et al. ......................... 15/102 |
| 5,868,857 | * | 2/1999 | Moinpour et al. .................... 134/902 |
| 5,901,399 | * | 5/1999 | Moinpour et al. .................... 15/88.3 |

FOREIGN PATENT DOCUMENTS

| 60143634 | 7/1985 | (JP) . |
| 06045302 | 2/1994 | (JP) . |
| 10242100 | 9/1998 | (JP) . |
| WO97/13590 | 4/1997 | (WO) . |

OTHER PUBLICATIONS

European Search Report, August 7, 2000 (pp. 1–3).

* cited by examiner

Primary Examiner—Robert J. Warden, Sr.
Assistant Examiner—Kaj K. Olsen
(74) Attorney, Agent, or Firm—Finnegan, Henderson, Farabow, Garrett & Dunner, L.LP.

(57) ABSTRACT

A double side cleaning apparatus includes a pair of roll-like brushes and at least one cleaning brush. The roll-like brushes are driven to rotate in opposite directions, and a semiconductor wafer is arranged between them in a non-contact manner. The cleaning brush is arranged near the pair of roll-like brushes. While the semiconductor wafer is arranged between the pair of roll-like brushes and its upper and lower surfaces are being cleaned, the cleaning brush brushes the side surface of the semiconductor wafer. A cleaning agent is supplied from the pair of roll-like brushes to the semiconductor wafer to clean it. Since the upper and lower surfaces of the semiconductor wafer are cleaned in a non-contact manner, dust can be removed efficiently (within a short period of time and a small space).

24 Claims, 4 Drawing Sheets

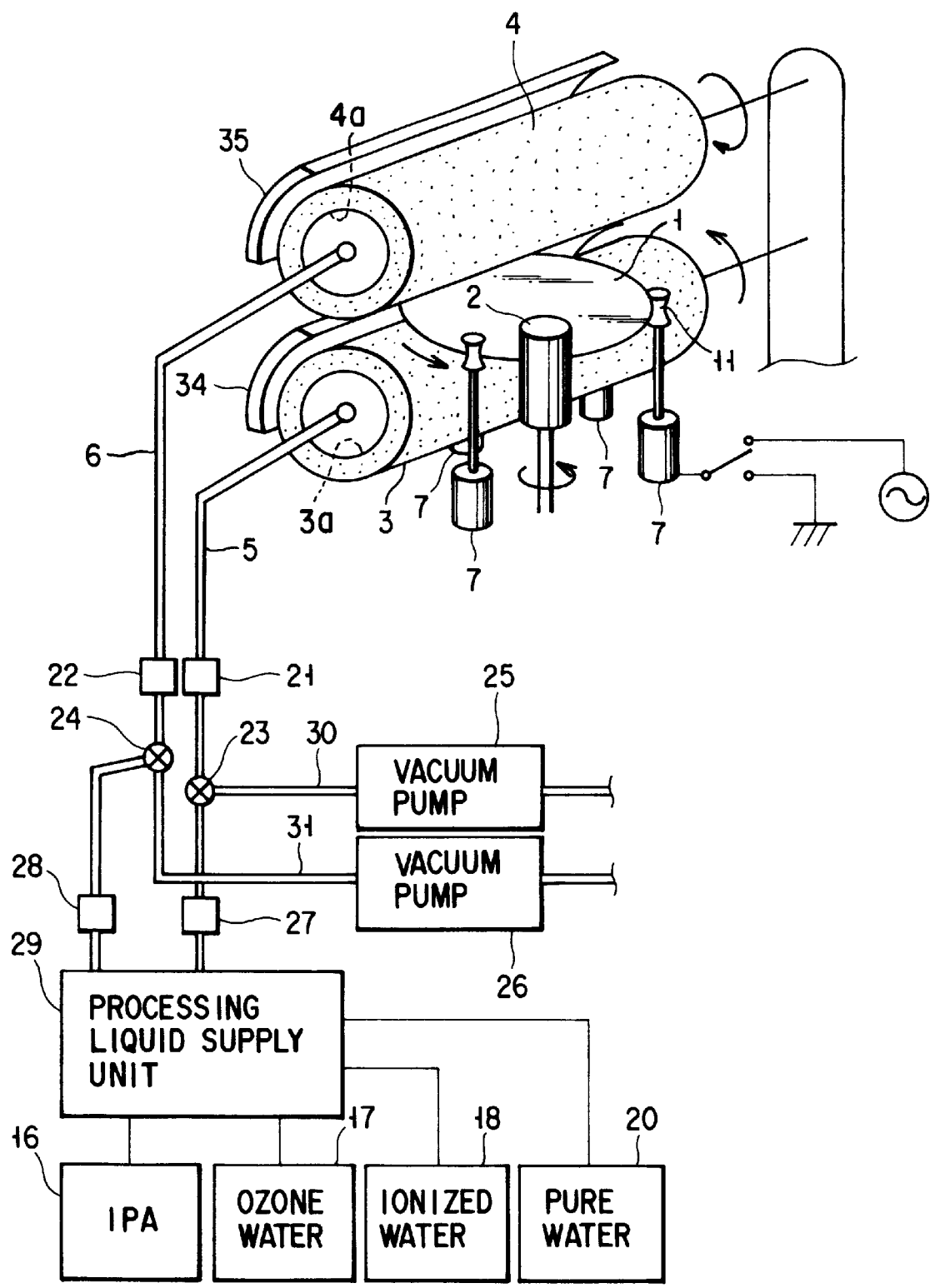
F I G. 1

DOUBLE SIDE CLEANING APPARATUS FOR SEMICONDUCTOR SUBSTRATE

BACKGROUND OF THE INVENTION

The present invention relates to a semiconductor wafer cleaning apparatus and, more particularly, to an apparatus for cleaning the upper and lower surfaces of a semiconductor wafer.

In the wafer processing steps of forming semiconductor elements, e.g., integrated circuits, on a semiconductor wafer, much effort is paid to remove dust attaching to the surface of the wafer.

For this purpose, the semiconductor wafer is cleaned by using, e.g., pure water, ultrapure water, or electrolytic ionized water obtained by electrolyzing pure water or ultrapure water. Although a fluorine-based solvent, e.g., flon, was previously used to clean the semiconductor wafer, it has been avoided recently as it adversely influences the environment, and water such as pure water or ultrapure water has begun to be utilized as the solvent.

Pure water refers to high-purity water having a resistivity of about 5 MΩcm to 18 MΩcm, from which impurities such as ions, fine particles, germs, organic substances, and the like are almost removed. Ultrapure water refers to very high-purity water manufactured by highly efficiently removing suspended materials and dissolved materials from pure water. When such water (pure water and ultrapure water will be generally called pure water hereinafter) is electrolyzed, electrolytic ionized water, e.g., anode ionized water (acid water) having high oxidizing properties and cathode ionized water (alkali water) having high reducing properties can be generated.

To clean the semiconductor wafer, the wafer is held on a vacuum chuck type spin chuck and is rotated. In this state, a cleaning liquid is dropped onto a rotating roll-like brush. The roll-like brush comes into contact with the semiconductor wafer to remove dust attaching to it. Thereafter, dropping of the cleaning liquid is stopped, and the semiconductor wafer is rotated at a high speed, thereby drying the surface of the semiconductor wafer.

According to the cleaning method described above, dust on the surface of the semiconductor wafer where the active region is formed can be removed. However, as the integration degree of the semiconductor integrated circuit devices, e.g., ICs and LSIs, increases, the integrated circuits are micropatterned at a higher density. In the step such as photolithography or etching, the influence of even dust on the lower or side surface of the semiconductor wafer on the process cannot be neglected.

As a countermeasure for this, the upper and lower surfaces of the semiconductor wafer may be cleaned simultaneously. Since a semiconductor wafer during cleaning must be held by some means, it is difficult to sufficiently clean its upper and lower surfaces. In a conventional roll type single wafer cleaning apparatus, cleaning is performed by supplying processing liquids, e.g., chemicals and pure water, from the outer circumferences of the rolls. Therefore roll clogging and counter contamination caused by the rolls pose a problem. In addition, to dry the wafer, the wafer must be moved to a dry stage, leading to a complicated, large apparatus.

BRIEF SUMMARY OF THE INVENTION

It is an object of the present invention to provide a double side cleaning apparatus for a semiconductor substrate capable of effectively removing, while processing the semiconductor substrate, dust attaching to the upper and lower surfaces of the semiconductor substrate, within a short period of time.

It is another object of the present invention to provide a double side cleaning apparatus capable of not only cleaning the semiconductor substrate but also drying the cleaned semiconductor substrate quickly without contaminating it.

It is still another object of the present invention to provide a double side cleaning apparatus capable of cleaning not only the upper and lower surfaces but also the side surface of the semiconductor substrate effectively.

In order to achieve the above objects, according to the first aspect of the present invention, there is provided an apparatus for cleaning upper and lower surfaces of a semiconductor substrate, comprising:

a semiconductor holding mechanism for holding the semiconductor substrate;

a pair of roll-like brushes rotatably arranged to sandwich the semiconductor substrate not to be in contact therewith and made of a porous material having hollow portions; and a processing liquid supply device for supplying a high-pressure processing liquid into the hollow portions of the roll-like brushes and blowing the processing liquid toward the upper and lower surfaces of the semiconductor substrate at substantially equal pressures from outer surfaces of the roll-like brushes, thereby cleaning the upper and lower surfaces of the semiconductor substrate simultaneously.

With this arrangement, the upper and lower surfaces of the semiconductor wafer can be cleaned simultaneously and effectively.

The second aspect of the present invention has, in addition to the arrangement of the first aspect, a side surface cleaning brush. This side surface cleaning brush abuts against an edge portion of the semiconductor substrate, while the upper and lower surfaces of the semiconductor substrate are being cleaned with the roll-like cleaning brushes, to clean a side surface of the semiconductor substrate.

With this arrangement, not only the upper and lower surfaces but also the side surface of the semiconductor substrate, which is not cleaned conventionally, can be cleaned. This improves the reliability of the semiconductor processing steps.

The third aspect of the present invention has, in addition to the arrangement of the first aspect, a pressure reducing unit for reducing a pressure in the hollow portions of the roll-like brushes. The hollow portions are pressure-reduced with the pressure reducing unit to attract the upper and lower surfaces of the semiconductor substrate, thereby drying the semiconductor substrate.

With this arrangement, one apparatus can perform a series of processing operations starting from cleaning and ended with drying, so that the cleaning efficiency is improved. Since the number of steps is decreased, the risk of contaminating the semiconductor substrate can be reduced.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinbefore.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 1 is a perspective view of a double side cleaning apparatus according to the present invention;

DETAILED DESCRIPTION OF THE INVENTION

Figure 2:
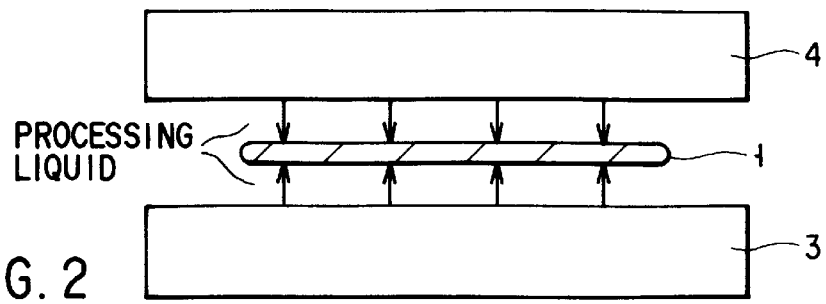
FIG. 2 is a sectional view of a pair of roll-like brushes according to the present invention, and a semiconductor wafer.

The present invention will be described with reference to the accompanying drawings.

FIG. 1 is a schematic view showing the arrangement of a double side cleaning apparatus having a pair of roll-like brushes 3 and 4 for cleaning a semiconductor wafer 1. A pair of roll-like brushes 3 and 4 have hollow portions 3a and 4a, and a cleaning processing liquid is supplied into the hollow portions 3a and 4a. More specifically, processing liquid supply pipes 5 and 6 for supplying the processing liquid into the hollow portions 3a and 4a of the roll-like brushes 3 and 4, respectively, are connected to the end portions of the roll-like brushes 3 and 4. The roll-like brushes 3 and 4 are synthetic suede substitute-like structures, which are alternatively referred to as synthetic leather substitute materials, obtained by impregnating thermoplastic synthetic fibers, the surfaces of which are raised, with polyurethane or the like, or are made of porous polyurethane formed like sponge. Hence, the processing liquid supplied into the hollow portions 3a and 4a of the roll-like brushes 3 and 4 is discharged to the outside easily because of the difference between the inner and outer pressures.

The processing liquid supply pipes 5 and 6 are connected to a processing liquid supply unit 29. The processing liquid supply unit 29 supplies either one of isopropyl alcohol (IPA) 16, ozone water (ORP+) 17, ionized water (acid water is ORP+ and alkali water is ORP−) 18, and pure water 20 to the hollow portions 3a and 4a of the roll-like brushes 3 and 4 respectively through the processing liquid supply pipes 5 and 6. The ionized water 18 is obtained by electrolyzing pure water or the like, and includes alkali ionized water and acid ionized water.

Water pressure controllers 27 and 28 shown in FIG. 1 are respectively mounted on the processing liquid supply pipes 5 and 6. The water pressure controllers 27 and 28 are constituted by, e.g., compression pumps. Branch pipes 30 and 31 connected to vacuum pumps 25 and 26 are connected to the upstream sides of the water pressure controllers 27 and 28 through branch valves 23 and 24, respectively. Ultrasonic vibrators (1 MHz to 1,000 MHz) 21 and 22 are connected between the branch valve 23 and the roll-like brush 3, and between the branch valve 24 and the roll-like brush 4, respectively.

Figure 8:
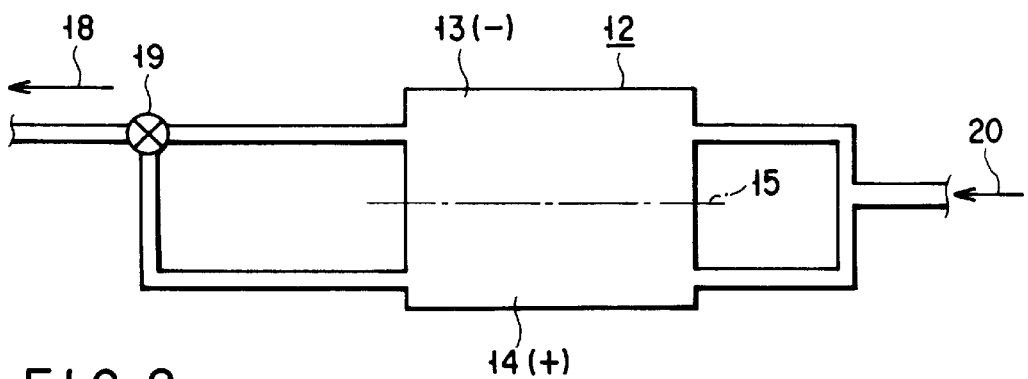
FIG. 8 is a sectional view of an ionized water generator.

Ionized water as the processing liquid is generated by an ionized water generator. FIG. 8 is a schematic sectional view showing the ionized water generator.

This ionized water generator generates ionized water by electrolyzing pure water or ultrapure water. Pure water refers to high-purity water having a resistivity of about 5 MΩcm to 18 MΩcm, from which impurities such as ions, fine particles, germs, organic substances, and the like are almost removed. Ultrapure water refers to very high-purity water having a higher purity than that of pure water and is manufactured by highly efficiently removing suspended materials and dissolved materials from water with an ultrapure water manufacturing unit. When such water is electrolyzed, ionized water, e.g., anode ionized water (acid water) having high oxidizing properties and cathode ionized water (alkali water) having high reducing properties can be generated.

A cathode chamber 13 and an anode chamber 14 are formed in the electrolytic cell of an ionized water generator 12. A cathode is arranged in the cathode chamber 13, while an anode is arranged in the anode chamber 14. These electrodes are made of a metal such as platinum or titanium, or carbon. In order to efficiently separate cathode ionized water generated in the cathode chamber 13 and anode ionized water generated in the anode chamber 14 from each other, the cathode chamber 13 and anode chamber 14 are partitioned from each other with a ceramic or polymeric porous partition film 15. The cathode of the electrolytic cell is connected to the negative pole of the DC power supply, and the anode is connected to the positive pole of the DC power supply. In the electrolytic cell, a dilute electrolyte solution obtained by adding a supporting electrolyte, e.g., ammonium chloride, to the pure water 20 supplied from the ultrapure water supply line of the electrolytic cell is electrolyzed by applying a power supply voltage from the power supply to it. The cathode ionized water and anode ionized water generated on the cathode side and anode side, respectively, as the result of this electrolysis are alkali water and acid water, respectively.

The cathode ionized water generated by the cathode chamber 13 is supplied outside through a cathode ionized water supply line, and the anode ionized water generated by the anode chamber 14 is supplied outside through an anode ionized water supply line. The cathode and anode ionized water supply lines are united into one ionized water supply line by a valve 19, and anode or cathode ionized water is supplied outside as the ionized water 18 through the valve 19.

Usually, alkali water is generated in the cathode chamber 13. Assume that a polishing unit used in the manufacture of a semiconductor device is employed. To perform polishing by using the alkali water, the alkali water is supplied to the abrasive cloth of the polishing unit by using the cathode ionized water supply line, connected to the electrolytic cell, as the ionized water supply line. In this case, the acid water generated in the anode chamber 14 is not necessary and is wasted accordingly.

To perform polishing by using acid water, the acid water is supplied to the abrasive pad by using the anode ionized water supply line, connected to the electrolytic cell, as the ionized water supply line. In this case, the alkali water generated in the cathode chamber 13 is not necessary and is wasted accordingly.

As described above, ionized water includes alkali water and acid water. Ionized water having arbitrary pH is generated by electrolyzing an electrolyte solution of, e.g., HCl, NHO$_3$, NH$_4$Cl, NH$_4$F, or the like, which is diluted in the electrolytic cell.

The ionized water generated by this ionized water generator is supplied to the double side cleaning apparatus shown in FIG. 1 and is used to clean semiconductor wafers 1. More specifically, the processing liquid containing the ionized water is pressurized by the compression pumps 27 and 28 and supplied into the hollow portions 3a and 4a of the roll-like brushes 3 and 4. The brushes 3 and 4 are formed to have a diameter of, e.g., 50 mm, and are rotated in the opposite directions.

As shown in FIG. 1, plurality of rotating terminals 11 hold a semiconductor wafer 1 arranged between roll-like brushes 3 and 4 while rotating. At least one of the rotating terminals 11 is made of a conductive material, e.g., carbon and used as a potential controller. The rotating terminal 11 as the potential controller is formed by intertwining thread-like carbon, knitting the intertwined thread into a braid, and machining the braid structure. The potential on the surface of the semiconductor wafer 1 can be controlled to a predetermined value as required by using the potential controller 7. When the potential is controlled in this manner, the dust attaching to the surface of the semiconductor wafer 1 can be removed easily.

As shown in FIG. 2, the pressurized processing liquid is sprayed from the hollow portions 3a and 4a of the roll-like brushes 3 and 4 to be blown toward the upper and lower surfaces of the semiconductor wafer 1, as indicated by arrows. Since the blow pressures from both hollow portions 3a and 4a are equal, the semiconductor wafer 1 having a wafer diameter of, e.g., 15.24 cm to 30.48 cm (6 inches to 12 inches) is held between the roll-like brushes 3 and 4 so as not to be in contact with them. More specifically, a liquid film is formed on the two major surfaces of the semiconductor wafer due to the hydroplaning phenomenon. Hence, the semiconductor wafer can be held in a non-contact manner.

The roll-like brushes 3 and 4 are arranged where they vertically sandwich the semiconductor wafer 1. In order to substantially equalize the blow pressures from all hollow portions 3a and 4a, the pressure of the processing liquid supplied to the hollow portion of the upper roll-like brush 4 must be decreased. In other words, it is preferable to adjust the pressure of the water pressure controller 27 to be higher than the pressure of the water pressure controller 28.

As shown in FIG. 1, plate-like dressers 34 and 35 for restoring the brush characteristics of the roll-like brushes 3 and 4 are arranged at positions close to the roll-like brushes 3 and 4.

These dressers 34 and 35 are ceramic dressers and are arcuated with the same radius of curvature as that of the roll-like brushes 3 and 4. While dressing them, the dressers 34 and 35 come into uniform contact with the rotating roll-like brushes 3 and 4, and the surfaces of the roll-like brushes 3 and 4 are uniformly dressed. The ceramic dressers 34 and 35 can be obtained by pressure-molding the powder of inorganic grains, e.g., alumina, silica, SiC, SiN, or the like, and calcining the molded body at a high temperature.

This apparatus also has a side-surface brush 2 which brushes the side surface of the semiconductor wafer 1 while cleaning the semiconductor wafer 1 with the roll-like brushes 3 and 4. The side-surface brush 2 is a synthetic suede substitute-like structure, which is alternatively referred to as a synthetic leather substitute material obtained by impregnating thermoplastic synthetic fibers, the surfaces of which are raised, with polyurethane or the like, or is made of porous polyurethane formed like sponge, similarly to the roll-like brushes 3 and 4. The side-surface brush 2 abuts against the side surface of the rotating semiconductor wafer 1 to remove dust attaching to it.

The processing liquid may similarly be supplied into the side-surface brush 2, in the same manner as in the roll-like brushes 3 and 4. In this case, the processing liquid supply unit 25, 26 can have the same arrangement as that of the supply unit 25, 26 for the roll-like brushes 3 and 4, and will not be illustrated.

With the cleaning apparatus described above, the upper and lower surfaces of the semiconductor wafer 1 can be cleaned sufficiently.

According to a preferable embodiment, the rotation speed of the roll-like brushes 3 and 4 is 10 rps to 1,000 rps. For example, the synthetic suede substitute-like structure as the material of the roll-like brushes 3 and 4, which is obtained by impregnating the thermoplastic synthetic fibers with polyurethane or the like and the surfaces of which are raised, is made of 65 wt % of polyester and 35 wt % of polyurethane, has a weight of 125 g/m$^2$, and a tensile strength of 4.0 kg/cm in the vertical direction and 3.0 kg/cm in the horizontal direction. Each roll-like brush is formed by boring the synthetic suede substitute-like structure formed into a cylindrical shape. Since the presence of a metal impairs the characteristics of the semiconductor wafer, both the member that seals the side surface of the roll-like brush and the processing liquid supply pipe are made of Teflon and not made of a metal.

After the semiconductor wafer 1 is cleaned with the roll-like brushes 3 and 4, the semiconductor wafer 1 is dried. The processing liquid in the processing liquid supply pipes 5 and 6 is removed, and thereafter the hollow portions 3a and 4a in the roll-like brushes 3 and 4 are evacuated by utilizing the vacuum pumps 25 and 26, thereby vacuum-drying the surface of the rotating semiconductor wafer 1.

The cleaning step of the semiconductor wafer 1 will be described with reference to FIGS. 3A to 5B.

Figure 3A:
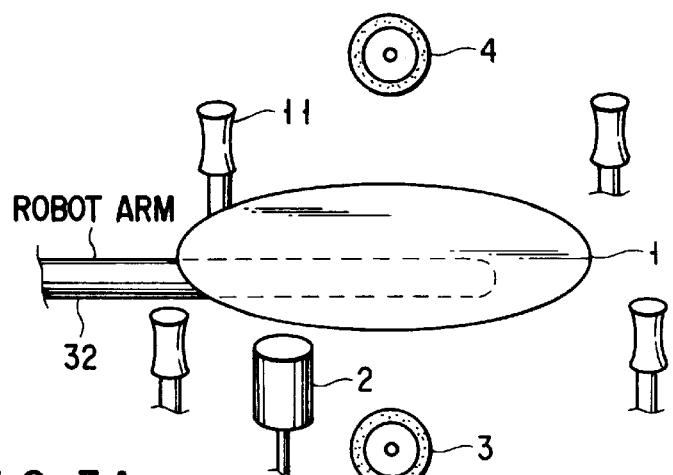
FIGS. 3A to 3C are perspective views for explaining the cleaning step of the present invention.
Figure 3B:
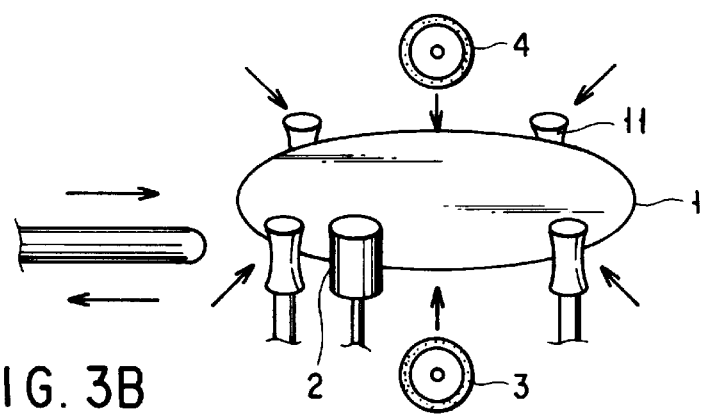

The semiconductor wafer 1, e.g., a silicon wafer, is conveyed to the cleaning position of the double side cleaning apparatus by utilizing a robot arm 32 (FIG. 3A). When the semiconductor wafer 1 is conveyed to the cleaning position, rotating terminals 11 are moved to support the semiconductor wafer 1 (FIG. 3B). Although four rotating terminals 11 are arranged in FIG. 3B, it is preferable to arrange six rotating terminals 11 because this stabilizes support and rotation of the semiconductor wafer 1.

Figure 3C:
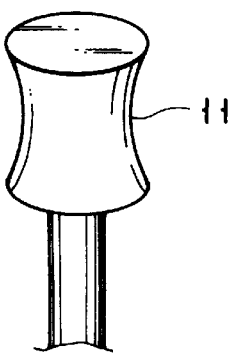

The distal end portion of each rotating terminals 11 is formed as shown in FIG. 3C, and its central portion is formed to have a small diameter in order to support the edge of the semiconductor wafer 1. As the material of the rotating terminals 11 other than which used as a potential controller, if silicone rubber is used, rotation of the semiconductor wafer 1 can be performed smoothly.

Figure 4A:
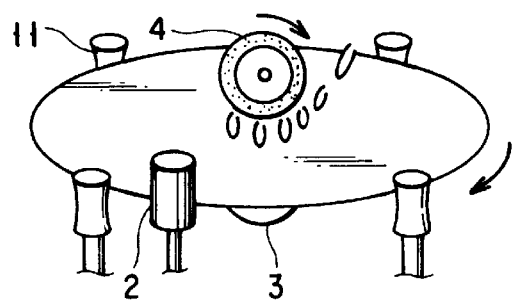
FIGS. 4A and 4B are perspective views for explaining the cleaning step of the present invention.

Once the semiconductor wafer 1 is supported by the rotating terminals 11, the robot arm 32 is separated from the cleaning position, and the roll-like brushes 3 and 4 are moved close to above and below the semiconductor wafer 1 (FIG. 3B). Simultaneously, the side-surface brush 2 is moved to abut against the side surface of the semiconductor wafer 1. While rotating the roll-like brushes 3 and 4 in the opposite directions, the processing liquid supplied from the processing liquid supply pipes 5 and 6 is supplied to the upper and lower surfaces of the rotating semiconductor wafer 1 to clean them such that the brushes 3 and 4 are not in contact with them (FIG. 4A). During cleaning done by the roll-like brushes 3 and 4, the side-surface brush 2 is rotated to clean the side surface of the semiconductor wafer 1 as well.

Figure 4B:
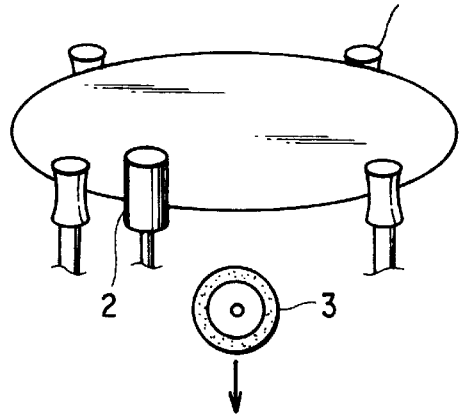
Figure 5A:
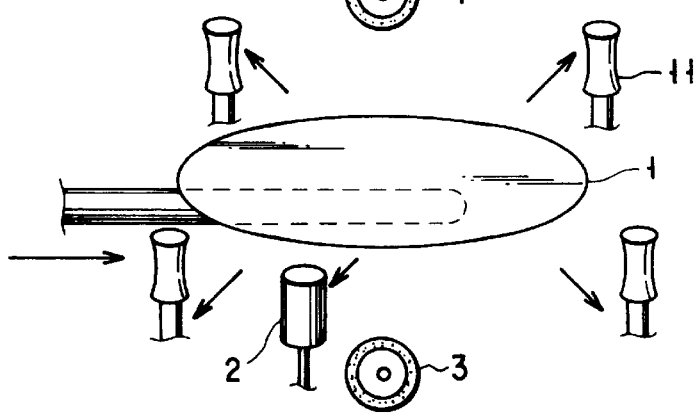
FIGS. 5A and 5B are perspective views for explaining the cleaning step of the present invention.
Figure 5B:
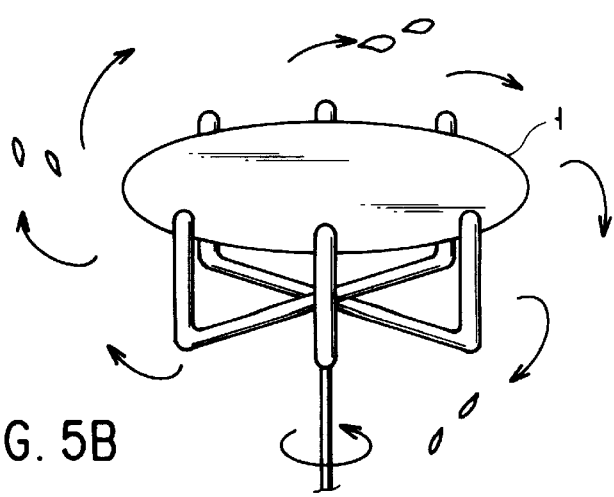

When wafer cleaning is ended, supply of the processing liquid is stopped, and the hollow portions 3a and 4a of the roll-like brushes 3 and 4 are evacuated by the vacuum pumps 25 and 26 (vacuum pumps) attached to the processing liquid supply pipes 5 and 6, thereby drying (vacuum-drying) the rotating semiconductor wafer 1. When vacuum drying is ended, the roll-like brushes 3 and 4 and the side-surface brush 2 are moved away (FIG. 4B). Thereafter, the semiconductor wafer 1 is held by the robot arm 32, and the rotating terminals 11 are removed from the semiconductor wafer 1 and are moved away from it (FIG. 5A). The semiconductor wafer 1 is conveyed to the drying chamber and spin-dried as required (FIG. 5B). The dried semiconductor wafer 1 is conveyed to the next step. Drying using IPA may be performed before vacuum drying.

In this cleaning apparatus, cleaning employing the processing liquid is performed after a step, e.g., polishing. A polishing unit for performing polishing will be briefly described.

Figure 6:
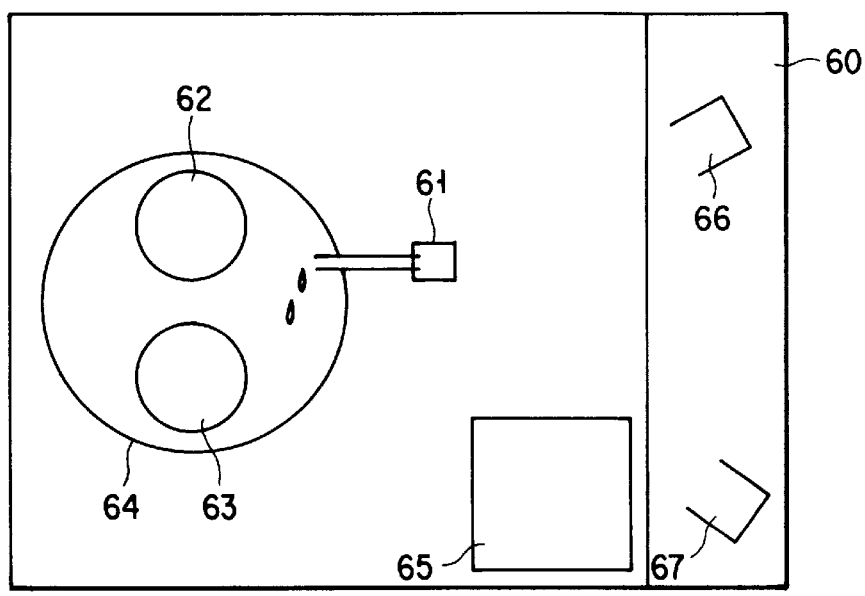
FIG. 6 is a block diagram of a polishing system employing the double side cleaning apparatus according to the present invention.

FIG. 6 is a block diagram of a system including the polishing unit. This system accepts the semiconductor wafer 1 from the preceding step, performs polishing by planarizing the polishing target film, e.g., a polysilicon film, an insulating film, a metal film, or the like, formed on the major surface of the semiconductor wafer 1 in accordance with CMP (Chemical Mechanical Polishing), performs the post processing of cleaning and drying, and sending the semiconductor wafer 1 to the subsequent step. This system has the polishing unit, a wafer cleaning/drying unit, and a wafer loading/unloading unit.

In the polishing unit, an abrasive pad 64 is mounted on a rotating abrasive disk (not shown). The abrasive pad 64 is made of foamed polyurethane, an unwoven polyurethane fabric, or the like. A rotating semiconductor wafer 62 is urged against the rotating abrasive pad 64 with a predetermined pressure, thereby polishing the polishing target film on the surface of the semiconductor wafer 62. The rotation speed of the abrasive disk during polishing is about 20 rpm to 200 rpm, and the urging pressure of the semiconductor wafer 62 is 50 g/cm$^2$ to 500 g/cm$^2$.

Polishing of the semiconductor wafer 62 on the abrasive pad 64 is done while dropping an abrasive agent (slurry) supplied from a abrasive agent supply pipe 61 onto the polishing surface of the abrasive pad 64.

Generally, each time an abrasive pad polishes a wafer, the polishing characteristics of the abrasive pad are degraded. Usually, after the abrasive pad polishes one to a plurality of wafers, the polishing surface of the abrasive pad is dressed by dressers.

In this embodiment, while polishing the semiconductor wafer 62, a dresser 63 is urged against the polishing surface of the abrasive pad to dress it. Namely, dressing and polishing are performed simultaneously. Then, the abrasive pad can always be utilized with good polishing characteristics. As the dresser 63, a ceramic dresser, a diamond dresser, or the like is utilized.

During wafer processing, the semiconductor wafer 62 is conveyed from a wafer supply unit 66 of a wafer loading/unloading portion 60 to the polishing unit portion. After being polished, the semiconductor wafer 62 is sent to a wafer cleaning drying unit 65, and is cleaned and dried by the double side cleaning apparatus of the present invention. The dried semiconductor wafer 62 is sent to the wafer loading/unloading portion 60, and is conveyed to the next step from a wafer output section 67.

The processing liquid used for cleaning includes IPA, ozone water, pure water, and ionized water, as shown in FIG. 1, and cleaning is performed by appropriately selecting these processing liquids. Selection and combination of the processing liquids are determined by the type of the preceding step. As the processing liquid, other than those described above, auxiliary materials, e.g., a surfactant, hydrofluoric acid, or hydrochloric acid, are available. Note that ionized water includes acid water and alkali water. More specifically, examples of the cleaning sequence are: A. cleaning with alkali water→cleaning with acid water→vacuum drying; B. cleaning with alkali water→cleaning with pure water→cleaning with acid water→cleaning with pure water→vacuum drying; C. cleaning with alkali water→cleaning with acid water→cleaning with pure water→drying with IPA→vacuum drying; D. cleaning with surfactant-added acid water→vacuum drying; and E. cleaning with ozone water containing hydrofluoric acid or hydrochloric acid→drying with IPA→vacuum drying. IPA prevents generation of water glass on the surface of the wafer.

Cleaning of the polished semiconductor wafer is performed through different sequences in accordance with the material of the polishing film formed on the semiconductor wafer. Sequence D described above is suitable for cleaning a semiconductor wafer having a polysilicon film or silicon oxide film as the polishing target film. To clean the semiconductor wafer having a metal film as the polishing target film, the sequence (F) wherein cleaning with acid water and cleaning with dilute hydrofluoric acid are alternatively repeated is performed.

According to the present invention, the cleaning time is reduced to about ⅓ that of the conventional case.

As has been described above, with the above arrangement, the upper and lower surfaces of the semiconductor wafer are performed in a non-contact manner, and accordingly dust can be removed efficiently within a short period of time and a small space. Dust can be efficiently removed not only from the upper and lower surfaces but also from the side surface of the semiconductor wafer. Since cleaning and drying are performed with the same apparatus, wafer processing can be performed quickly. The present invention is not limited to the embodiment described above, but various changes and modifications may be made without departing from the spirit and scope of the invention.

Figure 7:
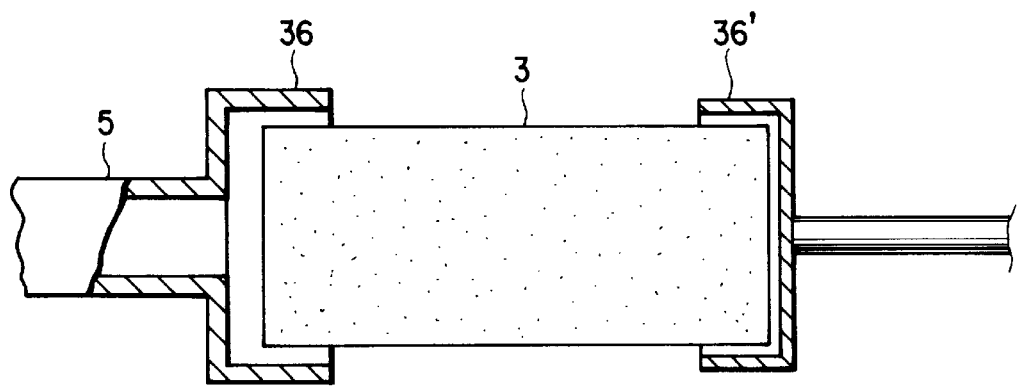
FIG. 7 is a sectional view of one roll-like brush of the present invention.

For example, the roll-like brush 3 may have an arrangement as shown in FIG. 7.

FIG. 7 is a sectional view of a roll-like brush 3. The roll-like brush 3 is hollow but its side surfaces are sealed with sealing bodies 36 and 36' made of an insulating member made of, e.g., Teflon. A processing liquid supply pipe 5 is connected to the sealing body 36, and a processing liquid is supplied through the processing liquid supply pipe 5.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. An apparatus for cleaning upper and lower surfaces of a semiconductor substrate, comprising:

a semiconductor holding mechanism for holding the semiconductor substrate;

a pair of roll-like brushes each having an outer surface rotatably arranged to have the semiconductor substrate sandwiched therebetween apart from the roll-like brushes by a distance sufficient for bringing about a hydroplaning phenomenon of a high-pressure processing liquid being discharged away from said roll-like brushes and made of a porous material having hollow portions; and a processing liquid supply device configured to supply the high-pressure processing liquid into said hollow portions of said roll-like brushes and discharge said processing liquid away from said hollow portions of said roll-like brushes and from said outer surfaces toward the upper and lower surfaces of the semiconductor substrate at substantially equal pressures for exerting balancing forces about the upper and lower surfaces of the semiconductor substrate so as to further bring about the hydroplaning phenomenon and thereby clean simultaneously both the upper and lower surfaces of the semiconductor substrate.

2. An apparatus according to claim 1, further comprising a side-surface cleaning brush which abuts against an edge portion of the semiconductor substrate, while the upper and lower surfaces of the semiconductor substrate are being cleaned with said roll-like cleaning brushes, to clean a side surface of the semiconductor substrate.

3. An apparatus according to claim 1, further comprising a holding member which abuts against a side surface of the semiconductor substrate to rotatably hold the semiconductor substrate.

4. An apparatus according to claim 3, wherein the holding member comprises a distal end portion having a first diameter and a central portion having a second diameter smaller than the first diameter of the distal end portion.

5. An apparatus according to claim 3, further comprising a potential control unit operatively connected to the holding member for selectively controlling a potential of the surface of the semiconductor substrate so as to assist the roll-like brushes in removing a substance from the surface of the semiconductor substrate.

6. An apparatus according to claim 1, wherein when said roll-like brushes include a first roll-like brush arranged above the semiconductor substrate and a second roll-like brush arranged below the semiconductor substrate, and wherein said processing liquid supply unit is configured to increase a first pressure of the processing liquid supplied to the hollow portion of the second roll-like to be larger than a second pressure of the processing liquid supplied to the hollow portion of the first roll-like brush so as to substantially equalize the first and second pressures of the processing liquid while the processing liquid is blown toward the upper and lower surfaces of the semiconductor substrate.

7. An apparatus according to claim 1, wherein said roll-like brushes are made of polyurethane foamed like sponge.

8. An apparatus for cleaning upper and lower surfaces of a semiconductor substrate, comprising:

a semiconductor holding mechanism for holding the semiconductor substrate;

a pair of roll-like brushes each having an outer surface rotatably arranged to sandwich the semiconductor substrate not to be in contact therewith and made of a porous material having hollow portions;

a processing liquid supply device for supplying a high-pressure processing liquid into said hollow portions of said roll-like brushes and blowing said processing liquid toward the upper and lower surfaces of the semiconductor substrate at substantially equal pressures from each of said outer surfaces of said roll-like brushes, thereby cleaning the upper and lower surfaces of the semiconductor substrate simultaneously; and a pressure reducing unit for reducing a pressure in said hollow portions of said roll-like brushes, wherein said hollow portions are pressure-reduced with said pressure reducing unit to attract ambient substances about the upper and lower surfaces of the semiconductor substrate toward said hollow portions of said roll-like brushes, thereby drying the semiconductor substrate.

9. An apparatus according to claim 8, further comprising at least one side holding member configured for holding a side surface of the semiconductor substrate.

10. An apparatus according to claim 9, wherein the at least one side holding member comprises a distal end portion having a first diameter and a central portion having a second diameter smaller than the first diameter of the distal end portion.

11. An apparatus according to claim 9, further comprising a potential control unit operatively connected to the at least one side holding member for selectively controlling a potential of the surface of the semiconductor substrate so as to assist the roll-like brushes in removing a substance from the surface of the semiconductor substrate.

12. An apparatus for cleaning upper and lower surfaces of a semiconductor substrate, comprising:

a semiconductor holding mechanism for holding the semiconductor substrate;

a pair of roll-like brushes each having an outer surface rotatably arranged to sandwich the semiconductor substrate so as not to be in contact therewith and made of a porous material having hollow portions;

a processing liquid supply device configured to supply the high-pressure processing liquid into said hollow portions of said roll-like brushes and discharge said processing liquid away from said hollow portions and toward the upper and lower surfaces of the semiconductor substrate at substantially equal pressures from each of said outer surfaces of said roll-like brushes to exert balancing forces on the upper and lower surfaces of the semiconductor substrate, and thereby clean simultaneously the upper and lower surfaces of the semiconductor substrate; and a potential control unit disposed near said roll-like brushes so as to contact a surface of the semiconductor substrate and selectively control a potential of the surface of the semiconductor substrate so as to assist the roll-like brushes in removing a substance from the surface of the semiconductor substrate.

13. An apparatus according to claim 12, further comprising at least one side holding member configured for holding a side surface of the semiconductor substrate.

14. An apparatus according to claim 13, wherein the at least one side holding member comprises a distal end portion having a first diameter and a central portion having a second diameter smaller than the first diameter of the distal end portion.

15. An apparatus according to claim 13, wherein the potential control unit is operatively connected to the at least one side holding member for distributing the potential through the holding member to the surface of the semiconductor substrate.

16. An apparatus for cleaning upper and lower surfaces of a semiconductor substrate, comprising:

a semiconductor holding mechanism for holding the semiconductor substrate;

a pair of roll-like brushes each having an outer surface rotatably arranged to sandwich the semiconductor substrate so as not to be in contact therewith and made of a porous material having hollow portions;

a processing liquid supply device for supplying a high-pressure processing liquid into said hollow portions of said roll-like brush and discharging said processing liquid toward the upper and lower surfaces of the semiconductor substrate at substantially equal pressures from each of said outer surfaces of said roll-like brushes thereby cleaning the upper and lower surfaces of the semiconductor substrate simultaneously; and a potential control unit comprising a carbon rotating terminal disposed near said roll-like brushes so as to come into contact with the semiconductor substrate, thereby controlling a potential of the semiconductor substrate.

17. An apparatus according to claim 16, wherein said semiconductor holding mechanism has a holding member which abuts against a side surface of the semiconductor substrate to rotatably hold the semiconductor substrate, and said carbon rotating terminal is arranged in said holding member.

18. An apparatus according to claim 16, further comprising at least one side holding member configured for holding a side surface of the semiconductor substrate.

19. An apparatus according to claim 18, wherein the at least one side holding member comprises a distal end portion having a first diameter and a central portion having a second diameter smaller than the first diameter of the distal end portion.

20. An apparatus according to claim 18, wherein the potential control unit is operatively connected to the at least one side holding member for distributing the potential through the holding member to the surface of the semiconductor substrate.

21. An apparatus for cleaning upper and lower surfaces of a semiconductor substrate, comprising:

a semiconductor holding mechanism for holding the semiconductor substrate;

a pair of roll-like brushes each having and outer surface rotatably arranged to sandwich the semiconductor substrate not to be in contact therewith and made of porous material having hollow portions;

a processing liquid supply device configured for supplying a high-pressure processing liquid into said hollow portions of said roll-like brushes and discharging said processing liquid toward the upper and lower surfaces of the semiconductor substrate at substantially equal pressures from each of said outer surfaces of said roll-like brushes so as to exert balancing forces on the upper and lower surfaces of the semiconductor substrate, and thereby clean the upper and lower surfaces of the semiconductor substrate simultaneously; and wherein said roll-like brushes are made of a synthetic leather substitute material obtained by impregnating thermoplastic synthetic fibers, the surface of which are raised, with polyurethane.

22. An apparatus according to claim 21, further comprising at least one side holding member configured for holding a side surface of the semiconductor substrate.

23. An apparatus according to claim 22, wherein the at least one side holding member comprises a distal end portion having a first diameter and a central portion having a second diameter smaller than the first diameter of the distal end portion.

24. An apparatus according to claim 22, further comprising a potential control unit operatively connected to the at least one side holding member for selectively controlling a potential of the surface of the semiconductor substrate so as to assist the roll-like brushes in removing a substance from the surface of the semiconductor substrate.

* * * * *

UNITED STATES PATENT AND TRADEMARK OFFICE
CERTIFICATE OF CORRECTION

PATENT NO. : 6,167,583 B1
DATED : January 2, 2001
INVENTOR(S) : Naoto Miyashita et al.

It is certified that error appears in the above-identified patent and that said Letters Patent is hereby corrected as shown below:

Title Page,
Item (74), in the "Attorney, Agent, or Firm"
Line 2, "L.LP." should read --L.L.P.--.

Column 9,
Line 49, after "second roll-like", insert --brush--.

Column 12,
Line 5, "having and outer" should read --having an outer--.

Signed and Sealed this

Fourteenth Day of August, 2001

Attest:

*Nicholas P. Godici*

NICHOLAS P. GODICI
*Attesting Officer*   *Acting Director of the United States Patent and Trademark Office*